(12) United States Patent
Yuan et al.

(10) Patent No.: US 9,274,438 B1
(45) Date of Patent: Mar. 1, 2016

(54) METHOD AND SYSTEM FOR EXPOSING PHOTORESIST IN A MICROELECTRIC DEVICE

(75) Inventors: Hongping Yuan, Fremont, CA (US); Hai Sun, Milpitas, CA (US); Xianzhong Zeng, Fremont, CA (US); Winnie Yu, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 1695 days.

(21) Appl. No.: 12/146,370

(22) Filed: Jun. 25, 2008

(51) Int. Cl.
*G03C 5/04* (2006.01)
*G03F 7/20* (2006.01)
*H01L 21/027* (2006.01)

(52) U.S. Cl.
CPC ........ *G03F 7/70466* (2013.01); *H01L 21/0274* (2013.01)

(58) Field of Classification Search
USPC .................................................. 430/396, 394
See application file for complete search history.

(56) References Cited

U.S. PATENT DOCUMENTS

| 4,093,461 | A | * | 6/1978 | Loprest et al. ................. 430/193 |
| 6,117,622 | A | | 9/2000 | Eisele et al. |
| 6,348,301 | B1 | | 2/2002 | Lin |
| 6,398,430 | B1 | | 6/2002 | Jeoung et al. |
| 6,448,164 | B1 | | 9/2002 | Lyons et al. |
| 6,774,044 | B2 | | 8/2004 | Ke et al. |
| 6,807,662 | B2 | | 10/2004 | Toublan et al. |
| 7,064,846 | B1 | | 6/2006 | Amblard et al. |
| 7,099,057 | B2 | * | 8/2006 | Parker et al. .................... 359/15 |
| 7,258,965 | B2 | | 8/2007 | Frost et al. |
| 7,824,826 | B2 | * | 11/2010 | Hsu et al. .......................... 430/5 |
| 2008/0020296 | A1 | | 1/2008 | Hsu et al. |

* cited by examiner

*Primary Examiner* — Daborah Chacko Davis

(57) ABSTRACT

A method and system provide microelectric devices on fields on a substrate. Each field includes at least one microelectric device having a critical device feature and remaining device feature(s) distal from the critical device feature. The method and system include providing a photoresist layer for fabricating the microelectric devices and exposing the photoresist layer using a dark field mask. The dark field mask is for defining a critical mask feature corresponding to the critical device feature and exposing a first portion of the fields. The first portion includes not more than five percent of each field. The method and system further include exposing the photoresist layer using a clear field mask. The clear field mask is for defining remaining mask feature(s) corresponding to the remaining device feature(s). The clear field mask exposes a second portion of the fields that is different from the first portion.

12 Claims, 4 Drawing Sheets

METHOD AND SYSTEM FOR EXPOSING PHOTORESIST IN A MICROELECTRIC DEVICE

BACKGROUND

FIG. 1 depicts a conventional method 10 for fabricating conventional magnetic devices, such as read or write transducers. A photoresist layer is provided, via step 12. In some structures, for example for fabrication of poles, the photoresist layer may be desired to be thick, on the order of one to two microns or more. In other structures being fabricated, the photoresist layer may be thin. For example, the photoresist layer may be one-quarter to one-half micron. The photoresist layer typically covers substantially all of the substrate.

The substrate on which the magnetic device is fabricated includes a number of fields. The fields are typically aligned in an array of rows and columns. The fields of the magnetic device are exposed using a single mask in a particular sequence of fields, via step 14. The fields are generally exposed in groups in step 14. Typically, a single exposure using the single mask is performed for each group of fields. Thus, a pattern is defined in the conventional photoresist layer. Stated differently, the conventional photoresist mask is formed. For example, the mask features for structures including a main pole such as a perpendicular magnetic recording (PMR) pole, a shield, pads, connections, test markers, and other features may be formed in step 14.

The pattern in the conventional photoresist mask is transferred to form the magnetic device, via step 16. Step 16 might include removing a portion of the underlying magnetic recording device layer(s) and/or depositing additional layers for the features to be fabricated. For example, the PMR pole, shield, pads, connections, test markers, and other features may be formed while the appropriate mask remains in place. Thus, steps 12-16 may be taken when utilizing conventional photolithography in forming structures in the conventional magnetic recording device. Fabrication of the conventional PMR head 30 may then be completed.

Although the conventional method 10 may be used to form the conventional magnetic device, there may be drawbacks. In particular, there may be variations in the overlay of layers in the conventional magnetic device. For example, during fabrication of a perpendicular magnetic recording (PMR) pole, it is generally desirable for the main pole tip to be aligned with other structures in magnetic recording transducer. However, there may be some misalignments or offsets in the structures. For certain critical features, such as the PMR pole and shield, misalignments in the overlays may adversely affect performance of the conventional magnetic recording device.

BRIEF SUMMARY OF THE INVENTION

A method and system for providing a plurality of microelectric devices on a plurality of fields on a substrate is described. Each of the plurality of fields includes at least one microelectric device including a critical device feature and at least one remaining device feature distal from the critical device feature. The method and system include providing a layer of photoresist on the plurality of fields. The layer of photoresist is for fabricating the plurality of microelectric devices. The method and system further include exposing the layer of photoresist using a dark field mask. The dark field mask is for defining a critical mask feature corresponding to the critical device feature and exposing a first portion of the plurality of fields. The first portion includes not more than five percent of each of the plurality of fields. The method and system further include exposing the layer of photoresist using a clear field mask. The clear field mask is for defining at least one remaining mask feature corresponding to the at least one remaining device feature. The clear field mask exposes a second portion of the plurality of fields that is different from the first portion.

DETAILED DESCRIPTION OF THE PREFERRED EMBODIMENTS

Figure 1:
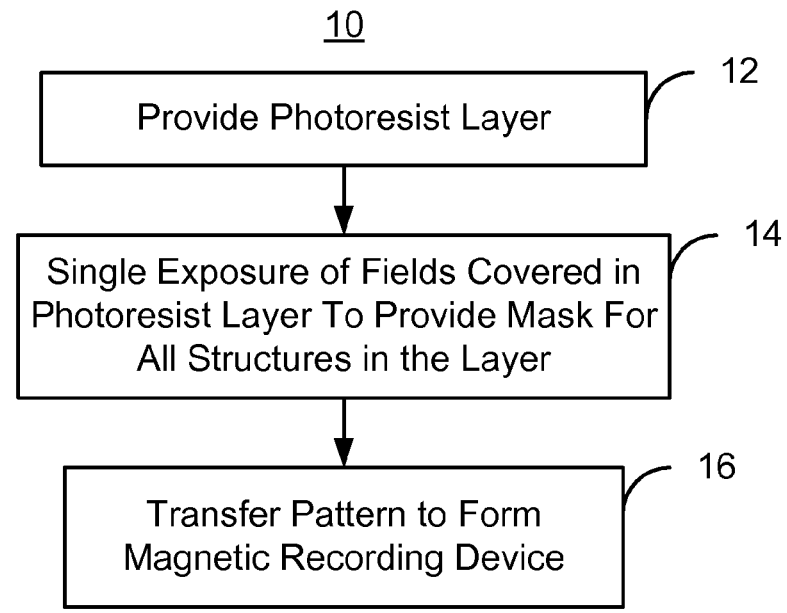
FIG. 1 is a flow chart depicting a conventional method for providing a conventional magnetic device.
Figure 2:
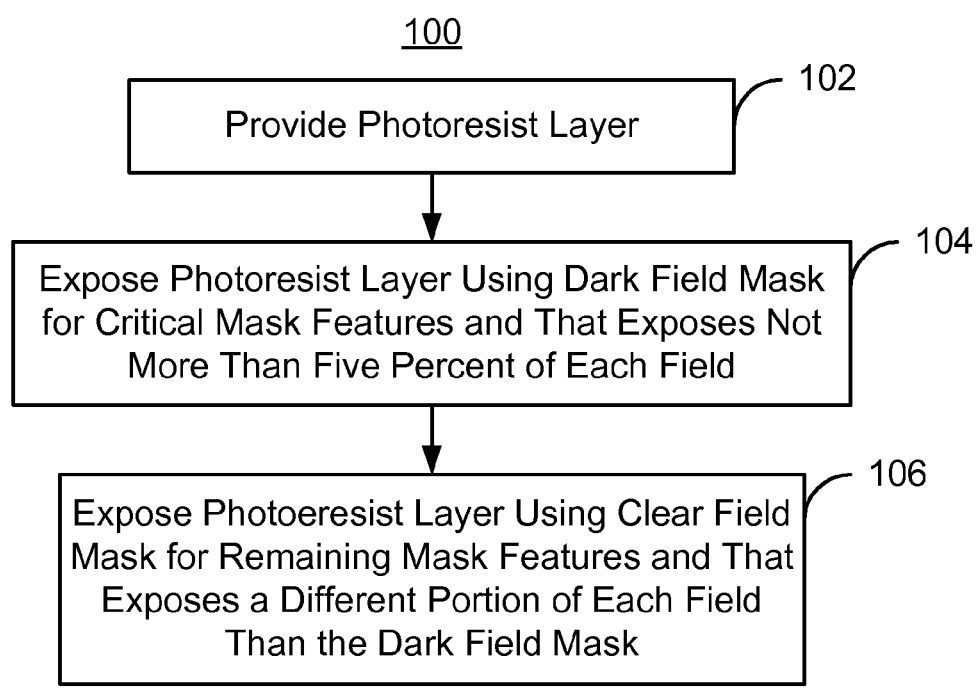
FIG. 2 is a flow chart depicting another exemplary embodiment of a method for providing a microelectric device.

FIG. 2 a flow chart depicting an exemplary embodiment of a method 100 for fabricating microelectric device(s) on a substrate. The substrate is divided into fields, each of which includes one or more microelectric devices. For simplicity, some steps in the method 100 may be omitted. Consequently, other and/or additional steps not inconsistent with the method and system may be used. The method 100 is described in the context of and may be used for providing particular structures in a read or write transducer. However, in another embodiment, the method 100 may be used in providing other structures that may be in other type(s) of device(s). The method 100 may commence after other structures have been provided in the fields of the substrate. For example, if the method 100 is used in providing a PMR pole, a read transducer, a shield and/or pole as well as other structures may already have been fabricated. Further, the method 100 might be combined with other methods of fabricating microelectric devices that are not inconsistent with the method 100.

The microelectric devices fabricated using the method 100 include one or more critical device features and one or more remaining device features distal from the critical device features. Critical device features include features which are desired to be closely aligned to other structures. For example, in a PMR transducer, the main pole is desired to be aligned with the shield and auxiliary pole(s) so that the transducer writes to the desired track. Thus, critical device features may include features such as the pole and/or nose thereof and shield. The remaining device features include those for which alignment may have greater tolerance. For example, remaining device features might include pads, connections, and/or test markers.

A layer of photoresist is provided on the plurality of fields of the substrate, via step 102. The layer of photoresist is for fabricating the plurality of microelectric devices. In particular, the photoresist is to form a mask that is used in fabricating critical device features as well as remaining device features. In one embodiment, the layer of photoresist is thick. For example, the layer of photoresist may have a thickness of at least one-half micron. In one such embodiment, the thickness of the layer of photoresist is at least one micron. In another such embodiment, the thickness of the layer of photoresist is two microns or more.

The layer of photoresist is exposed using a dark field mask that is configured to define critical mask features in the photoresist layer, via step 104. The critical mask features correspond to the critical device features. For example, the dark field mask may be used in forming trenches in the photoresist layer in which the poles and/or shields are to be deposited. In such an embodiment, the trenches are the critical mask features and the poles and/or shields the critical device features. Step 104 includes exposing a first portion of each the fields in some sequence while using the dark field mask. The first portion of each field is the region in which the critical device features are to be formed. The first portion of each field is a small part of the field. For example, in one embodiment, the first portion includes not more than five percent of the area of the field. In another embodiment, the first portion includes a smaller percentage of the area of the field. For example, in one embodiment, smaller areas, such as on the order of one percent or less of the area of the field, are desired.

Another exposure is performed for the photoresist layer using a clear field mask that is configured to define remaining mask features, via step 106. The remaining mask features correspond to the remaining device features. For example, the clear field mask may be used to form trenches and via holes for pads and/or connectors. In such an embodiment, the trenches and via holes are the remaining mask features, while the pads and connectors are the remaining device features. The clear field mask exposes a second portion of each field that is different from the first portion exposed in step 104. Stated differently, the portion of the photoresist layer exposed and patterned in step 106 is distinct from the portion of the photoresist layer exposed and patterned in step 104. In one embodiment, step 106 is performed by covering the portion of the photoresist layer exposed in step 104 with a chrome mask. Consequently, only the regions which the clear field mask would expose to light would be patterned in step 106. Although step 106 is described as occurring after step 104, in one embodiment, step 106 may be performed before step 104. In one embodiment, the total energy which is used in both exposure sequences is relatively high. For example, the total energy in steps 104 and 106 may be at least fifty millijoules per square centimeter. Once the method 100 is completed, the pattern of the photoresist mask may be transferred to the microelectric device. Thus, the critical device features and remaining device features may be formed after the critical mask features and the remaining mask features are provided.

Using the method 100, fabrication of the microelectric device may be improved. For example, photoresist typically exhibits shrinkage. In one embodiment, it has been determined that variations in overlay for a PMR pole or other critical device features may be due in large part to shrinkage, or deformation, of the layer of photoresist used. For example, for PMR pole and/or shield structures, a relatively thick photoresist layer of photoresist may be used. For example, the photoresist thickness may be at least one to two microns. In such an embodiment, exposure of the photoresist layer may result in significant shrinkage of the photoresist layer. This shrinkage may be inconsistent and difficult to account for. It has been determined that even for such a thick photoresist layer, exposure of the first portion of the field using the dark field mask may result in less shrinkage of the photoresist layer in the first portion of the fields. Variations in the overlay for these portions of the microelectric devices may, therefore, be reduced. This improvement in overlay is expected to increase with decreasing area exposed using the dark field mask. Consequently, it may be desirable to expose the smallest area possible in step 104. For example, one percent or less of the area of each field may be desired to be exposed using the dark field mask. The clear field mask may expose a significantly larger portion of the microelectric device. However, photoresist shrinkage may not adversely affect performance because alignment of the remaining device features is less critical. Consequently, device fabrication and performance may be improved.

Figure 3:
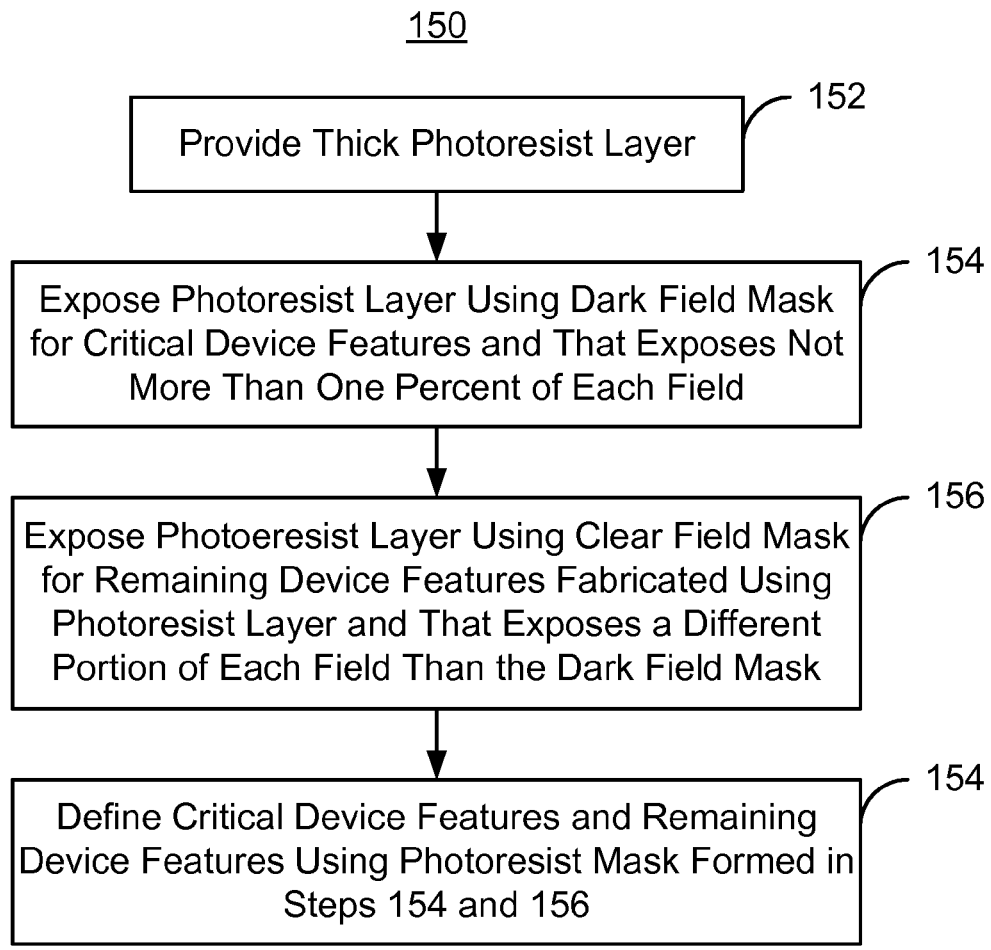
FIG. 3 is a flow chart depicting another exemplary embodiment of a method for providing a magnetic recording device.

FIG. 3 is a flow chart depicting another exemplary embodiment of a method 150 for providing magnetic recording devices. Thus, the method 150 may be viewed as an application of the method 100. FIGS. 4-7 depict an exemplary embodiment of a substrate 200 and microelectric devices therein during fabrication. Note that FIGS. 4-7 are not drawn to scale. The method 150 is described in the context of the substrate 200. Referring to FIGS. 3-7, the method 150 is thus used in providing magnetic recording devices on the substrate 200. For simplicity, some steps in the method 150 may be omitted. Consequently, other and/or additional steps not inconsistent with the method and system may be used. The method 150 is described in the context of particular structures in a read or write transducer. However, in another embodiment, the method 150 may be used in providing other structures. The method 150 might also be combined with other methods of fabricating microelectric devices that are not inconsistent with the method 150.

Figure 4:
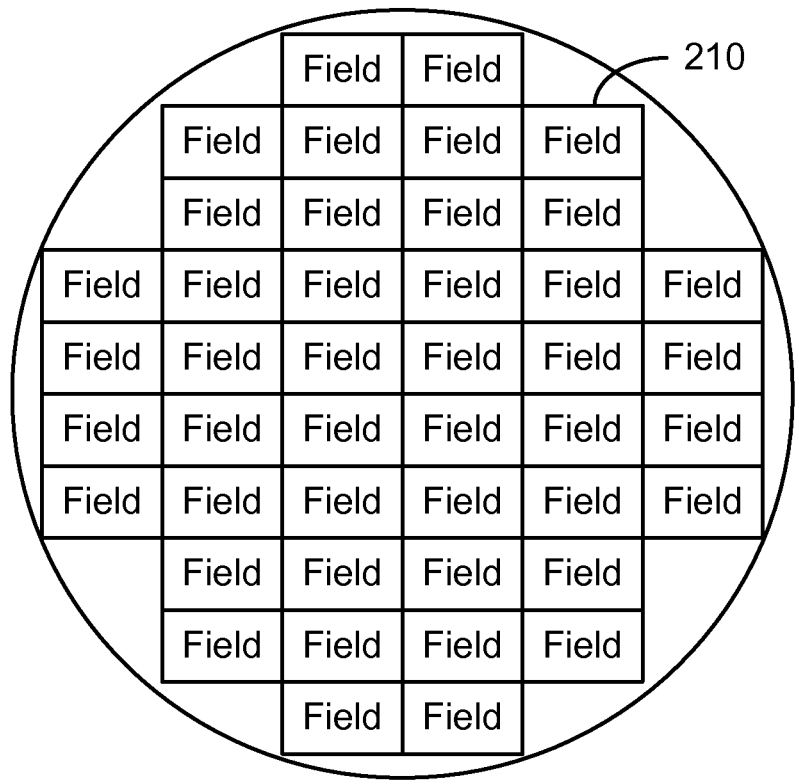
FIG. 4 depicts a plan view of an exemplary embodiment of a substrate for microelectric devices.

FIG. 4 depicts a plan view of the substrate 200 before the method 150 commences. The substrate 200 is divided into fields 210, each of which includes one or more magnetic recording devices which, for simplicity, are not shown. The method 150 may commence after other structures have been provided in the fields 210 of the substrate. For example, the method 150 may commence after a read transducer, a shield and/or pole such as an auxiliary pole, as well as other structures, have been fabricated.

Figure 5:
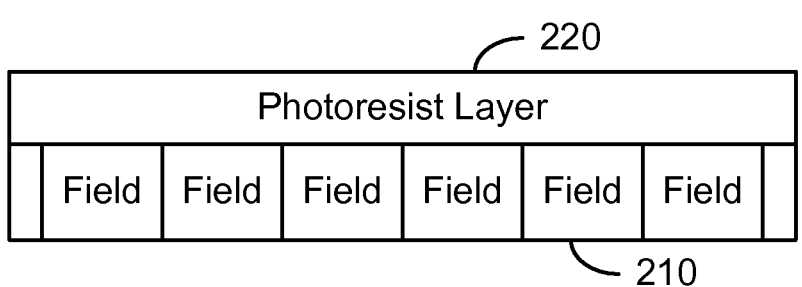
FIG. 5 depicts a side view of an exemplary embodiment of a substrate for microelectric devices.

A thick layer of photoresist is provided on the plurality of fields 210, via step 152. The photoresist is to form a mask that is used in fabricating the critical and remaining device features. The critical device features may include features such as a main and/or auxiliary pole, a nose thereof and/or a shield. The remaining device features include those for which alignment may have greater tolerance. For example, remaining device features might include pads, connections, and/or test markers. FIG. 5 depicts a side view of the substrate 200 after step 152 is performed. Consequently, the photoresist layer 220 is shown as residing on fields 210. The thick layer of photoresist 220 is at least one-half micron thick. In one embodiment, the thickness of the layer 220 of photoresist is at least one micron. In another embodiment, the thickness of the layer of photoresist is two microns or more.

Figure 6:
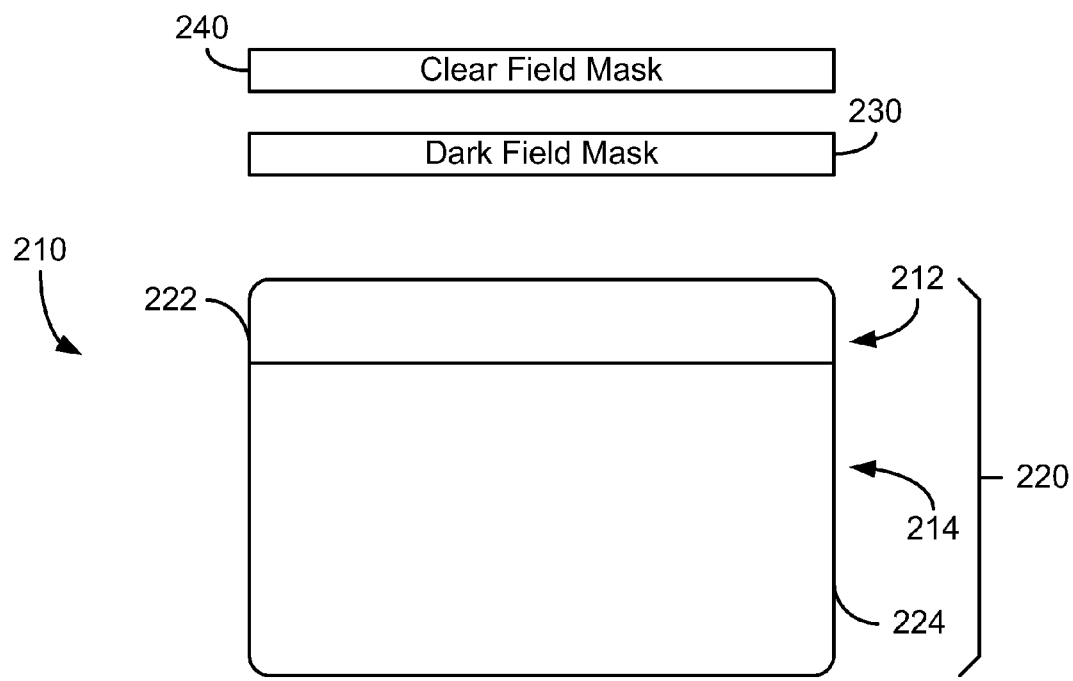
FIG. 6 depicts an exemplary embodiment of a field for microelectric devices.

The thick layer of photoresist 220 is exposed using a dark field mask that is configured to define critical mask features in the photoresist layer, via step 154. FIG. 6 depicts a field 210 during steps 154 and 156. Thus, the field 210, dark field mask 230, and clear field mask 240 are shown. For clarity, only a single field 210 is shown. However, the discussion applies to all fields 210 exposed in step 154.

The dark field mask 230 is used in step 154 to expose the photoresist layer 220 on the field 210. A first portion 212 of the field 210 and thus a first portion 222 of the photoresist layer 220 are exposed in step 154. The critical mask features (not explicitly shown in FIG. 6) are formed in the region 222 of the photoresist layer 220 and correspond to critical device features (not explicitly shown in FIG. 6). For example, the dark field mask 230 may be used in forming trenches in the photoresist layer 220. The poles and/or shields are to be deposited in such trenches. In such an embodiment, the trenches are the critical mask features and the poles and/or shields the critical device features. The first portion 212 of each field 210 is, therefore, the region in which the critical device features are to be formed. The first portion 212 of each field 210 is a small part of the field. For example, in one embodiment, the first portion 210 includes not more than one percent of the area of the field 210.

An exposure is performed for the photoresist layer 220 using the clear field mask 240, via step 156. The clear field mask 240 is configured to define remaining mask features (not explicitly shown in FIG. 6), which correspond to the remaining device features (not explicitly shown in FIG. 6). For example, the clear field mask may be used to form trenches and via holes for pads and/or connectors. In such an embodiment, the trenches and via holes are the remaining mask features, while the pads and connectors are the remaining device features. The clear field mask 240 exposes a second portion 214 of each field and a second portion 224 of the photoresist layer 220. The portions 214 and 224 are different from the portions 212 and 222, respectively. Stated differently, the portions 212 and 222 do not overlap the portions 214 and 224, respectively. In one embodiment, step 156 is performed by covering the portion 212/222 with a chrome mask. Consequently, only the regions 214/224 which the clear field mask 240 would expose to light would be patterned in step 156. Although step 156 is described as occurring after step 154, in one embodiment, their order may be reversed. In one embodiment, the total energy which is used in both exposures in steps 154 and 156 is at least fifty millijoules per square centimeter.

Figure 7:
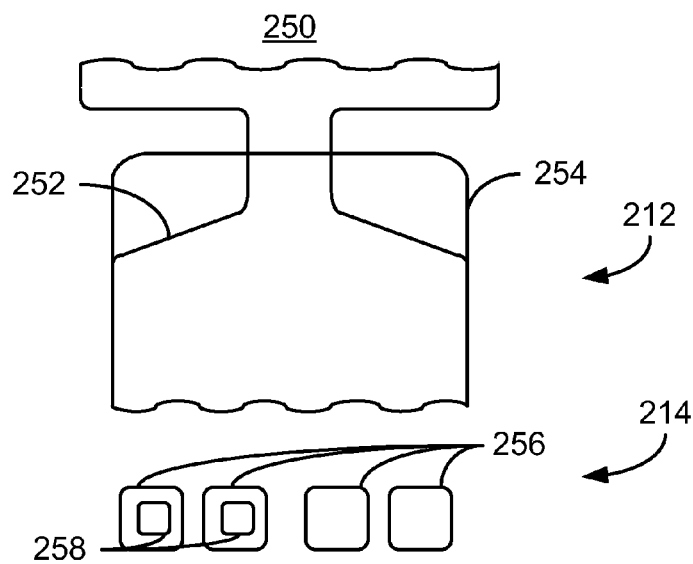
FIG. 7 depicts an exemplary embodiment of a microelectric device.

The critical device features and remaining device features are fabricated after the critical mask features and the remaining mask features are provided, via step 158. For example, the PMR pole and/or shield as well as any pads may be defined. Thus, step 158 may include multiple sub-steps. FIG. 7 depicts a portion of one magnetic recording device 250 residing in a field 210 after step 158 is performed. For simplicity, only a portion of the device 250 in region 212 and a portion of the device 250 in region 214 are shown. A portion of the pole 252 and shield 254 are shown in region 212. Pads 256 and connection 258 are shown in region 214. For simplicity, the features 252, 254, 256, and 258 are shown in close proximity. However, in most embodiments, the critical device features 252 and 254 would be distant from the remaining features 256 and 258.

Using the method 150, fabrication of magnetic recording devices 250 may be improved. For example, shrinkage of the photoresist layer 220 in the region 222 may be reduced or substantially eliminated. Variations in the overlay for features in these portions 212 of the field 210 in which the magnetic recording devices 250 are fabricated may be reduced. Although the clear field mask 240 may expose a significantly larger portion of the field 210, alignment of the remaining device features 256 and 258 is less critical. Thus, shrinkage of the portion 224 of the photoresist layer 220 may not adversely affect performance of features in the regions 214. Consequently, device fabrication and performance may be improved.

We claim:

1. A method for providing a plurality of microelectric devices on a plurality of fields on a substrate, each of the plurality of fields including at least one microelectric device including a critical device feature and at least one remaining device feature distal from the critical device feature, the method comprising:
provideing a layer of photoresist on the plurality of fields, the layer of photoresist for fabricating the plurality of microelectric devices;
exposing the layer of photoresist using a dark field mask, the dark field mask for defining a critical mask feature corresponding to the critical device feature and exposing a first portion of the plurality of fields, the first portion including not more than five percent of each of the plurality of fields, at least part of the at least one critical device feature being oriented at an angle other than ninety degrees from the at least one remaining device feature; and
exposing the layer of photoresist using a clear field mask, the clear field mask for defining at least one remaining mask feature corresponding to the at least one remaining device feature, the clear field mask exposing a second portion of the plurality of fields, the second portion being different from the first portion.

2. The method of claim 1 wherein the dark field mask exposes not more than one percent of each of the plurality of fields.

3. The method of claim 1 wherein the clear field mask exposes not more than ninety-nine percent of each of the plurality of fields.

4. The method of claim 1 wherein the plurality of microelectric devices include a plurality of magnetic devices.

5. The method of claim 4 wherein the critical device feature includes at least one of a portion of a main pole, a portion of a perpendicular magnetic pole, and a portion of a shield.

6. The method of claim 5 wherein the critical device feature includes a nose region of the main pole, a nose region of the perpendicular magnetic pole, and a nose region of the shield.

7. The method of claim 1 wherein the at least one remaining device feature includes at least one of at least one pad, at least one connection, and at least one test marker.

8. The method of claim 1 wherein the layer of photoresist has a thickness of at least one-half micron.

9. The method of claim 8 wherein the thickness of the layer of photoresist is at least one micron.

10. The method of claim 9 wherein the thickness of the layer of photoresist is at least two microns.

11. The method of claim 1 wherein the plurality of fields are exposed to at least fifty millijoules per square centimeter for the step of exposing the layer of photoresist using the dark field mask and the step of exposing the layer of photoresist using the clear field mask.

12. The method of claim 1 further comprising:
defining the critical device feature and the at least one remaining device feature after the critical mask feature and the remaining mask feature are provided.

* * * * *